US006798702B2

(12) United States Patent
Tsuji

(10) Patent No.: US 6,798,702 B2
(45) Date of Patent: Sep. 28, 2004

(54) SEMICONDUCTOR MEMORY DEVICE CAPABLE OF TESTING DATA LINE REDUNDANCY REPLACEMENT CIRCUIT

(75) Inventor: Takaharu Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 180 days.

(21) Appl. No.: 10/121,870

(22) Filed: Apr. 15, 2002

(65) Prior Publication Data

US 2003/0043648 A1 Mar. 6, 2003

(30) Foreign Application Priority Data

Aug. 28, 2001 (JP) ........................................ 2001-257738

(51) Int. Cl.$^7$ .............................................. G11C 29/00
(52) U.S. Cl. ...................................... 365/200; 365/201
(58) Field of Search ............................ 365/200, 189.01, 365/201, 198, 189.08, 230.08, 63, 102

(56) References Cited

U.S. PATENT DOCUMENTS 6,072,737 A * 6/2000 Morgan et al. ............. 365/201

6,324,657 B1 * 11/2001 Fister et al. .................. 714/42

FOREIGN PATENT DOCUMENTS

JP  11-250688 A  9/1999

* cited by examiner

*Primary Examiner*—David Nelms
*Assistant Examiner*—Thinh T Nguyen
(74) *Attorney, Agent, or Firm*—McDermott Will & Emery LLP

(57) ABSTRACT

In a shift switch circuit for replacing a data line, a transmission gate circuit connecting node N2 corresponding to ith write data line to node N4 corresponding to ith read data line is provided. An operation of the shift switch circuit can be confirmed according to whether or not an output corresponding to provided data input signal D<i> is observed as data output signal Q<i>. Preferably, a transmission gate connecting i+1th write data line to an output data line is further provided, in order to further ensure operation confirmation. When a fuse circuit is set to replace a data line, ratio of successful chip repairing will be higher.

4 Claims, 15 Drawing Sheets

FIG.9

| TMBUSCHK1 | TMBUSCHK2 | SFT<i> | SFTE<i> | SHIFT SWITCH OPERATION |
|---|---|---|---|---|
| L | L | L | L | <i> SIDE ON |
| L | L | H | H | <i+1> SIDE ON |
| H | L | L | L | <i> SIDE ON |
| H | L | H | L | <i> SIDE ON |
| L | H | L | H | <i+1> SIDE ON |
| L | H | H | H | <i+1> SIDE ON |
| H | H | L | / | |
| H | H | H | / | |

FIG. 16  PRIOR ART

| DEFECTIVE IO | SFT⟨n:0⟩ | | | | | | | | | | | |
|---|---|---|---|---|---|---|---|---|---|---|---|---|
| | ⟨0⟩ | ⟨1⟩ | ⟨2⟩ | ⟨3⟩ | ⟨4⟩ | ⟨5⟩ | ⟨6⟩ | ⟨7⟩ | ... | ⟨n-2⟩ | ⟨n-1⟩ | ⟨n⟩ |
| 0 | 1 | 1 | 1 | 1 | 1 | 1 | 1 | 1 | ... | 1 | 1 | 1 |
| 1 | 0 | 1 | 1 | 1 | 1 | 1 | 1 | 1 | ... | 1 | 1 | 1 |
| 2 | 0 | 0 | 1 | 1 | 1 | 1 | 1 | 1 | ... | 1 | 1 | 1 |
| 3 | 0 | 0 | 0 | 1 | 1 | 1 | 1 | 1 | ... | 1 | 1 | 1 |
| 4 | 0 | 0 | 0 | 0 | 1 | 1 | 1 | 1 | ... | 1 | 1 | 1 |
| 5 | 0 | 0 | 0 | 0 | 0 | 1 | 1 | 1 | ... | 1 | 1 | 1 |
| 6 | 0 | 0 | 0 | 0 | 0 | 0 | 1 | 1 | ... | 1 | 1 | 1 |
| 7 | 0 | 0 | 0 | 0 | 0 | 0 | 0 | 1 | ... | 1 | 1 | 1 |
| ... | | | | | | | | | | | | |
| n-1 | 0 | 0 | 0 | 0 | 0 | 0 | 0 | 0 | ... | 0 | 1 | 1 |
| n | 0 | 0 | 0 | 0 | 0 | 0 | 0 | 0 | ... | 0 | 0 | 1 |
| INITIAL SETTING | 0 | 0 | 0 | 0 | 0 | 0 | 0 | 0 | ... | 0 | 0 | 0 |

SEMICONDUCTOR MEMORY DEVICE CAPABLE OF TESTING DATA LINE REDUNDANCY REPLACEMENT CIRCUIT

BACKGROUND OF THE INVENTION

1. Field of the Invention

The present invention relates to a semiconductor memory device, and more specifically to a semiconductor memory device having a data line redundancy replacement circuit of a shifting type.

2. Description of the Background Art

A semiconductor memory device has redundancy memory cells in addition to normal memory cells. Yield is enhanced by replacing and repairing defective memory cell among normal memory cells with a redundancy memory cell.

Recently, there has been a strong demand to increase bus width in order to improve data transfer rate. Accordingly, the number of data lines tends to be larger, correspondingly making the number of column address smaller. Particularly in a dynamic random access memory (DRAM) embedded along with a logic circuit on a semiconductor device to implement system-on-chip, a configuration has been changing from one with 32-bit bus width and 256-bit column address (adopted in a conventional memory) to, for example, one with 256-bit bus width and 16-bit column address.

Conventionally, a defective chip has been repaired through replacement of a bit line by making a switch of a column address. When the number of columns is small, however, high repair ratio cannot be expected without preparing a relatively large number of redundancy memory cells. Therefore, in many cases, a redundancy memory cell and a redundancy data line connected thereto are prepared so as to replace a data line connected to a defective memory cell or a data line having a defect (hereinafter, referred to as a defective data line) with a redundancy data line.

FIG. 13 is a block diagram showing a conventional example of a semiconductor memory device with a data line redundancy replacement configuration.

Referring to FIG. 13, a conventional semiconductor memory device includes: a memory cell array 502; a row decoder 504 selecting a row in memory cell array 502; a read amplifier and write driver circuit 506 reading and writing data from/to memory cell array 502 through a data line; a fuse circuit 508 programming replacement information according to a position of a defective data line; a shift information latch circuit 510 outputting shift control signal SFT<n:0> upon receiving an output from fuse circuit 508; a data line shift circuit 512 determining a data line pair to be used from n+1 normal data line pairs and a redundancy data line pair according to shift control signal SFT<n:0>; and an input/output circuit 514 communicating data with the data line pair selected by data line shift circuit 512.

N+1 normal data line pairs and a redundancy data line pair read and write data from/to memory cell array 502. Read amplifier and write driver circuit 506 includes a plurality of read amplifier and write driver units 516.

Input/output circuit 514 includes a plurality of input/output buffers 518 corresponding to data signals DQ<0>–DQ<n> respectively. Data line shift circuit 512 includes shift switches 512.0–512.n corresponding to the plurality of input/output buffers 518 respectively.

The normal data line pair includes data lines IO, NIO. The redundancy data line pair includes data lines SIO, NSIO.

The data line pair IO, NIO is connected to a memory cell through a sense amplifier circuit and a bit line in memory cell array 502. A read amplifier contained in read amplifier and write driver unit 516 amplifies data of the data line pair to generate a signal DBRA<n+1:0>. A write buffer circuit contained in read amplifier and write driver unit 516 drives the data line pair upon receiving a write data signal provided by signal DBWA<n+1:0>.

If a defect is found in a data line in the memory cell array, those shift switches 512.0–512.n which correspond to the defective data line are switched so that data in a next adjacent data line can be used. By shifting all the data lines positioned higher in bits than the defective data line, a redundancy data line can be used in place of the defective data line.

FIG. 14 is a circuit diagram showing a configuration of ith shift switch 512.i in FIG. 13.

Referring to FIG. 14, shift switch 512.i includes: an inverter 538 receiving and inverting shift control signal SFT<i>; a transmission gate circuit 544 activated in accordance with an output of inverter 538 and transmitting signal DBWB<i> as signal DBWA<i>; and a transmission gate circuit 546 activated in accordance with shift control signal SFT<i> and transmitting signal DBWB<i> as signal DBWA<i+1>. Transmission gate circuit 544 is activated when shift control signal SFT<i> is "0", while transmission gate circuit 546 is activated when shift control signal SFT<i> is "1".

Shift switch 512.i further includes a transmission gate circuit 540 activated in accordance with an output of inverter 538 and transmitting signal DBRA<i> as signal DBRB<i>; and a transmission gate circuit 542 activated in accordance with shift control signal SFT<i> and transmitting signal DBRA<i+1> as signal DBRB<i>. Transmission gate circuit 540 is activated when shift control signal SFT<i> is "0", while transmission gate circuit 542 is activated when shift control signal SFT<i> is "1".

When shift control signal SFT<i> in FIG. 14 is "0", "no shift" is indicated and signals DBWA<i>, DBRA<i> are selected. On the other hand, when shift control signal SFT<i> is "1", "shift" is indicated and signals DBWA<i+1>, DBRA<i+1> are selected.

FIG. 15 is a circuit diagram showing a configuration of transmission gate circuit 544 in FIG. 14.

Referring to FIG. 15, transmission gate circuit 544 includes: an inverter 552 receiving and inverting a signal provided to node E; a P channel MOS transistor connected between nodes A and B and receiving an output of inverter 552 at a gate; and an N channel MOS transistor 556 connected between nodes A and B and having a gate connected to node E. Transmission gate circuit 544 connects node A and node B when node E is supplied with H level, while it disconnects node A from node B when node E is supplied with L level.

Transmission gate circuits 546, 540, 542 are of the same configuration as transmission gate circuit 544, and description thereof will not be repeated.

FIG. 16 shows relation between a defective data line and shift control signal SFT<n:0> in FIG. 13.

Referring to FIGS. 13 and 16, when shift control signal is "0" or "1", "no shift" or "shift" is indicated respectively.

At initial setting, fuse circuit 508 has not been programmed and shift control signals SFT<0>–SFT<n> are all "0". Connection status of shift switches 512.0–512.n in FIG. 13 at that time is shown. At initial setting, redundancy data line pair is not used.

For example if a defect FA is present in n−1th data line pair of 0−nth data line pairs, fuse circuit 508 will be programmed in such a way that shift control signals SFT<0>–SFT<n−2> are set to be "0" and shift control signals SFT<n−1>, SFT<n> are set to be "1".

Then, at initial state as shown in FIG. 13, connection of two shift switches (shift switches 512.n−1, 512.n) among shift switches 512.0–512.n connected to 0−nth normal data line pairs is changed. Consequently, input/output buffer 518 inputting/outputting signal DQ<n> is connected to a redundancy data line pair and an input/output buffer inputting/outputting signal DQ<n−1> is connected to nth normal data line pair. N−1th data line pair having a defect FA is not connected to any input/output buffer 518.

In above-described configuration of a semiconductor memory device, if a defect is found in the inside of memory cell array 502 as defect FA, a defective chip can be repaired by means of data line shift circuit 512. If a defect is found in a connection path between data line shift circuit 512 and input/output circuit 514 or in the inside of data line shift circuit 512, however, repairing thereof is impossible.

Operation confirmation is performed per data line pair. Therefore, even if a defect is found in wafer testing, it is not possible to distinguish whether the defect is present in a data line (in which case a portion of memory cell array area can be repaired) or inside data line shift circuit 512 and input/output circuit 514. Thus, even though a defect is found inside data line shift circuit 512 as defect FB or in a connection portion of data line shift circuit 512 and input/output circuit 514 as defect FC, the defect cannot be determined as irreparable, and fuse circuit 508 will be programmed in order to repair the data line.

In particular, when a defect is present in a path as defect FB, which is not usually used for initial setting, presence of a defect could be determined only after actually programming fuse circuit 508 in an attempt to repair the chip. Programming fuse circuit 508 in such a case will cause lowering of repair ratio (yield ratio before and after repairing). Since programming fuse circuit 508 for an irreparable chip is useless, it is desirable to detect that a chip is irreparable and not to program the fuse circuit when that is the case.

Particularly when test period should be shortened for the purpose of cost reduction, next assembly process is often carried out without conducting a test at wafer stage after fuse circuit 508 is programmed for repairing. In such a case, if repair ratio is low, test yield after assembly will decrease, which is a problem in terms of cost.

SUMMARY OF THE INVENTION

An object of the present invention is to provide a semiconductor memory device capable of detecting a repairable chip to selectively program a fuse circuit and thus having improved repair ratio and production efficiency.

In summary, according to the present invention, a semiconductor memory device having a test mode and a normal mode as operation modes includes a memory cell array, a plurality of read data lines, a plurality of write data lines, a replacement control circuit and a data line shift circuit.

The memory cell array is divided into a plurality of areas. The plurality of read data lines are provided corresponding to the plurality of areas respectively to communicate data. The plurality of write data lines are provided corresponding to the plurality of areas respectively to communicate data. The replacement control circuit holds replacement information in a non-volatile manner and outputs a shift control signal in accordance with the replacement information. The data line shift circuit selects a prescribed number of read data lines to be used from the plurality of read data lines, and a prescribed number of write data lines to be used from the plurality of write data lines.

The data line shift circuit includes a first switch circuit connecting, in the normal mode, either one of first and second write data lines of the plurality of write data lines to a first input node in accordance with the shift control signal and connecting, in the test mode, a first write data line to the first input node; a second switch circuit connecting, in the normal mode, either one of first and second read data lines of the plurality of read data lines to a first output node in accordance with the shift control signal and connecting, in the test mode, a first read data line to the first output node; and a first data transmission circuit activated in the test mode and transmitting data of the first write data line to the first read data line.

According to an other aspect of the present invention, a semiconductor memory device having a test mode and a normal mode as operation modes includes a memory cell array, a plurality of data lines, a replacement control circuit and a data line shift circuit.

The memory cell array is divided into a plurality of areas. The plurality of data lines are provided corresponding to the plurality of areas respectively to communicate data. The replacement control circuit holds replacement information in a non-volatile manner and outputs a shift control signal according to the replacement information. The data line shift circuit selects a prescribed number of data lines to be used from the plurality of data lines.

The data line shift circuit includes a first switch circuit connecting either one of first and second data lines of the plurality of data lines to a first node in accordance with the shift control signal in the normal mode, and connecting both of the first and second data lines to the first node in the test mode; and a data transmission circuit activated in the test mode and transmitting data of the first data line to the second data line.

Therefore, the principal advantage of the present invention is that a path to transmit data to a memory cell array through a data line shift circuit can be confirmed and that a chip can be repaired efficiently.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates an operation of shift switch circuit 22b shown in FIG. 8.

FIG. 16 shows relation between a defective data line and shift control signal SFT<n:0> in FIG. 13.

DESCRIPTION OF THE PREFERRED EMBODIMENTS

Figure 1:
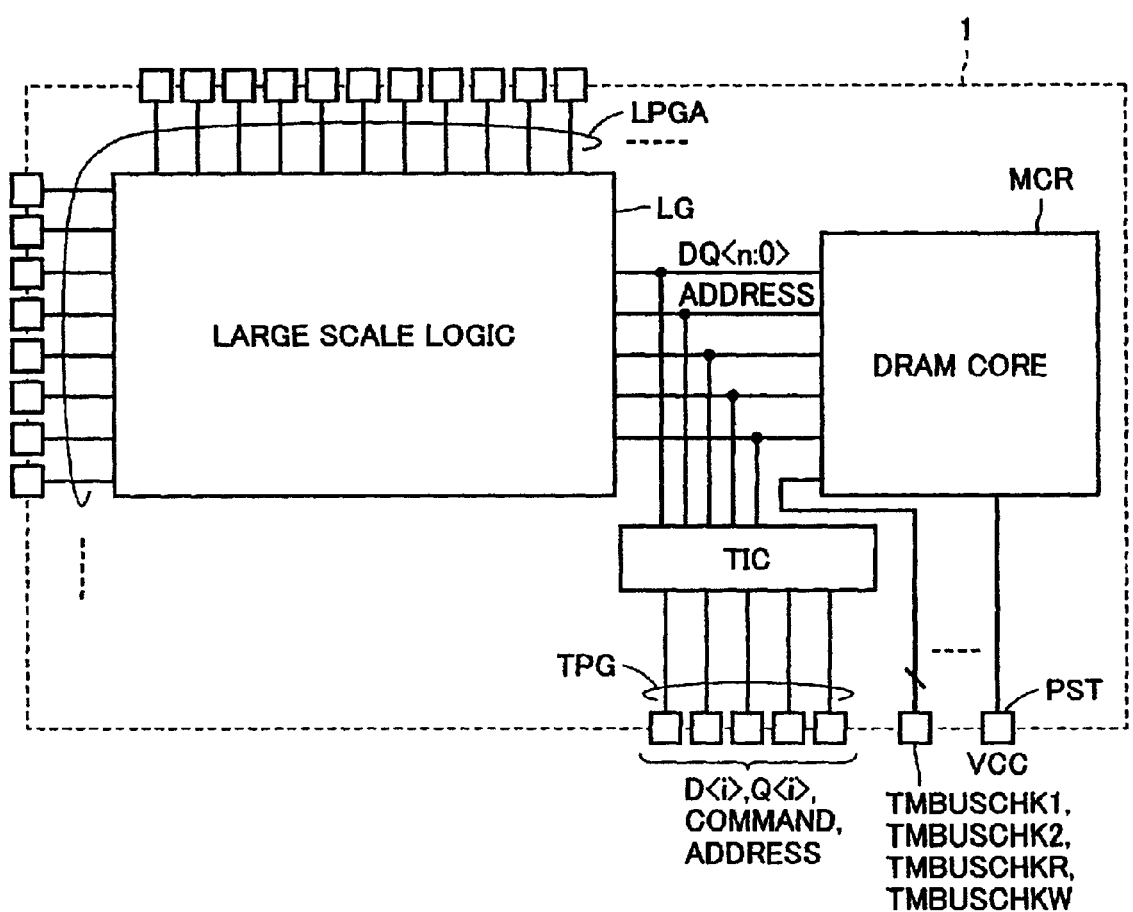
FIG. 1 is a schematic block diagram showing an overall configuration of a semiconductor memory device in a first embodiment of the present invention.

In the following, embodiments of the present invention will be described in detail with reference to the figures. It is noted that the same reference characters refer to the same or corresponding components in the figures.

(First Embodiment)

FIG. 1 is a schematic block diagram showing an overall configuration of a semiconductor memory device in a first embodiment of the present invention.

Referring to FIG. 1, a semiconductor memory device 1 which is a logic-embedded DRAM includes a large scale logic LG communicating signal LPGA with the outside; a DRAM core MCR controlled by large scale logic LG and communicating data therewith; and a test interface circuit TIC which, in testing, instead of large scale logic LG, provides a control signal and input data to DRAM core MCR and receives read data output from the same.

Test interface circuit TIC communicates test signal group TPG with the outside. Test signal group TPG includes input data D<i>, output data Q<i>, command signal COMMAND, address signal ADDRESS and the like.

DRAM core is supplied with power supply potential VCC from terminal PST. DRAM core MCR can also be provided directly from the outside with test control signals, such as TMBUSCHK1, TMBUSCHK2, TMBUSCHKR and TMBUSCHKW, for a test described later.

Figure 2:
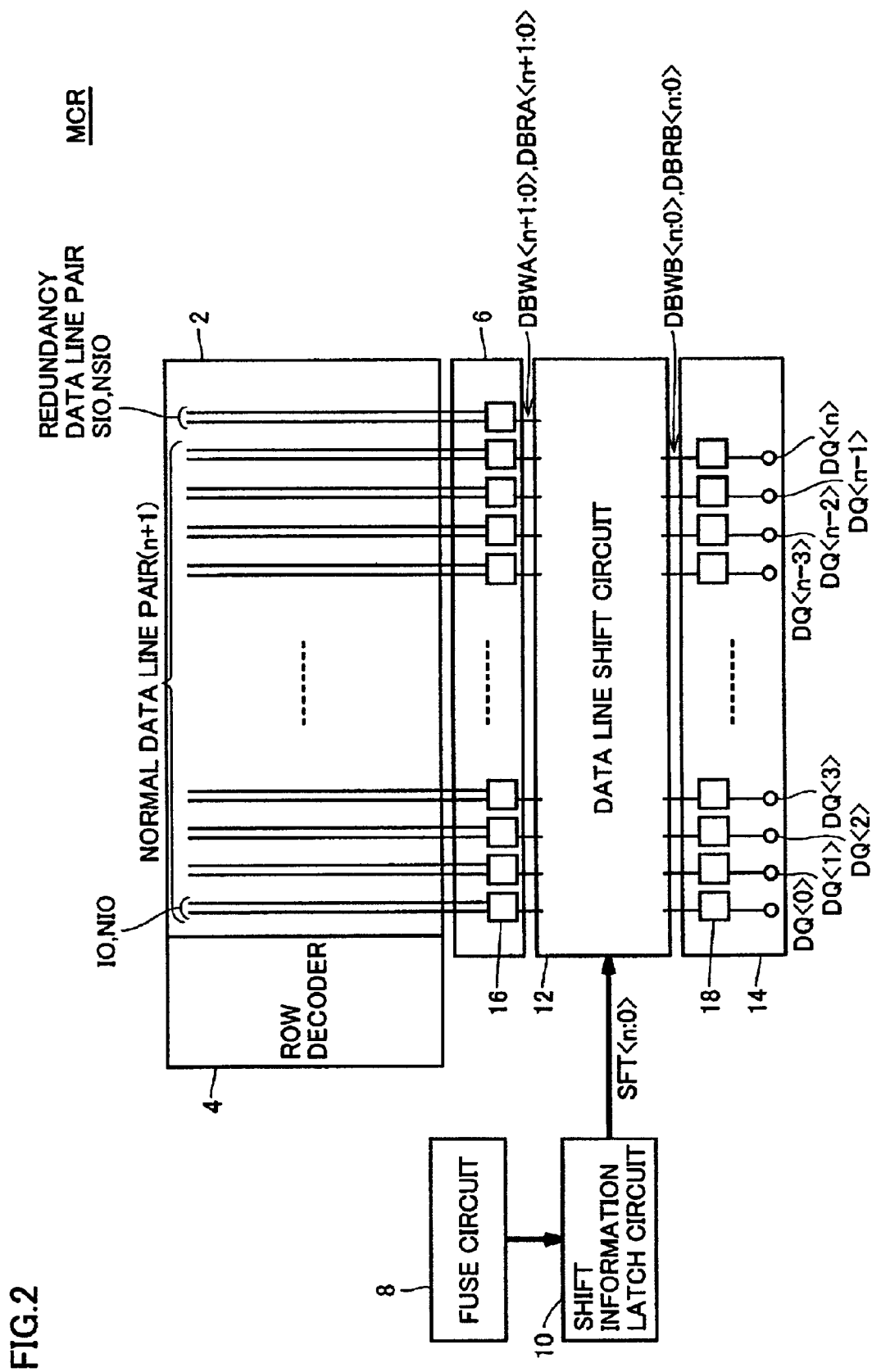
FIG. 2 is a block diagram showing a configuration of DRAM core MCR shown in FIG. 1.

FIG. 2 is a block diagram showing a configuration of DRAM core MCR shown in FIG. 1.

Referring to FIG. 2, DRAM core MCR includes: a memory cell array 2; a row decoder 4 selecting a row in memory cell array 2; a read amplifier and write driver circuit 6 reading and writing data from/to memory cell array 2 through a data line; a fuse circuit 8 programming replacement information according to a position of a defective data line; a shift information latch circuit 10 outputting shift control signal SFT<n:0> upon receiving an output of fuse circuit 8; a data line shift circuit 12 determining a data line pair to be used from n+1 normal data line pairs and a redundancy data pair in accordance with shift control signal SFT<n:0>; and an input/output circuit 14 communicating data with the data line pair selected by data line shift circuit 12.

N+1 pairs of normal data lines and a redundancy data line pair read and write data from/to memory cell array 2. The memory cell array is divided into a plurality of areas, which are allocated to n+1 normal data line pairs and the redundancy data line pair respectively. Read amplifier and write driver circuit 6 includes a plurality of read amplifier and write driver units 16.

Input/output circuit 14 includes a plurality of input/output buffers 18 corresponding to data signals DQ<0>–DQ<n> respectively.

The normal data line pair includes data lines IO, NIO. The redundancy data line pair includes data lines SIO, NSIO.

The pair of data lines IO, NIO is connected to a memory cell through a sense amplifier circuit and a bit line in memory cell array 2. A read amplifier contained in read amplifier and write driver unit 16 amplifies data of the data line pair to generate a signal DBRA<n+1:0>. A write buffer circuit contained in read amplifier and write driver unit 16 drives the data line pair upon receiving a write data signal provided by signal DBWA<n+1:0>.

Figure 3:
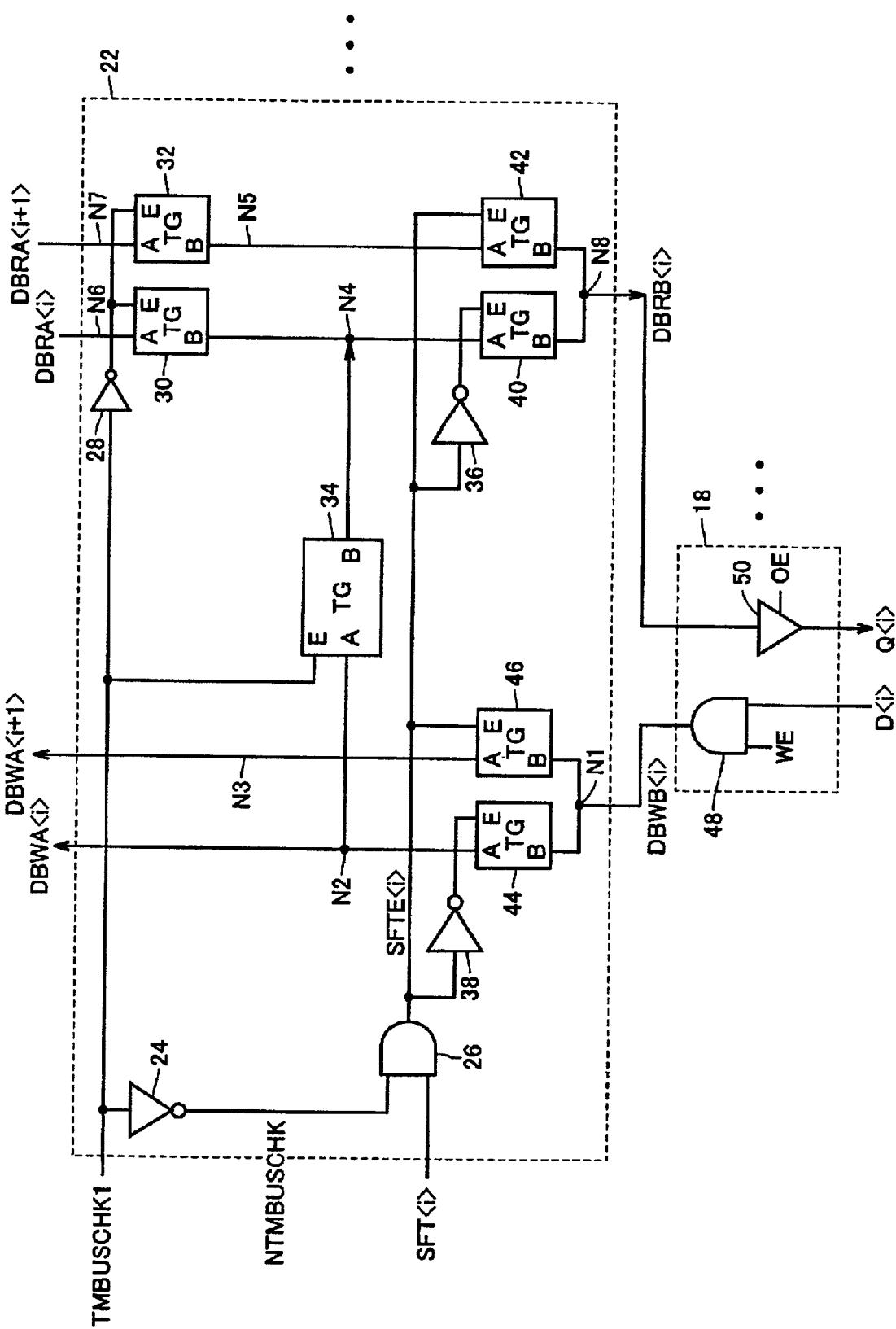
FIG. 3 is a circuit diagram showing a configuration of ith shift switch circuit 22 included in data line shift circuit 12 in FIG. 2 and corresponding input/output buffer 18.

FIG. 3 is a circuit diagram showing a configuration of ith shift switch circuit 22 included in data line shift circuit 12 in FIG. 2 and corresponding input/output buffer 18.

Referring to FIG. 3, input/output buffer 18 includes an AND circuit 48 outputting signal DBWB<i> upon receiving control signal WE and input data signal D<i>; and a tristate buffer circuit 50 outputting data output signal Q<i> when control signal OE is activated, upon receiving signal DBRB<i>.

Shift switch circuit 22 includes an inverter 24 receiving and inverting test control signal TMBUSCHK1 and outputting signal NTMBUSCHK; an AND circuit 26 outputting signal SFTE<i> upon receiving shift control signal SFT<i> and signal NTMBUSCHK; inverters 36, 38 receiving and inverting signal SFTE<i>; and an inverter 28 receiving and inverting test control signal TMBUSCHK1.

Shift switch circuit 22 further includes a transmission gate 44 having node B connected to node N1 provided with signal DBWB<i> and node A connected to node N2 outputting signal DBWA<i>, and receiving an output of inverter 38 at node E; a transmission gate circuit 46 having node A connected to node N3 outputting signal DBWA<i+1> and node B connected to node N1, and receiving signal SFTE<i> at node E; and a transmission gate circuit 34 having node A connected to node N2 and node B connected to node N4, and receiving test control signal TMBUSCHK1 at node E.

Shift switch circuit 22 further includes a transmission gate circuit 30 having node A connected to node N6 provided with signal DBRA<i> and node B connected to node N4, and receiving an output of inverter 28 at node E; a transmission gate circuit 32 having node A connected to node N7 provided with signal DBRA<i+1> and node B connected to node N5, and receiving an output of inverter 28 at node E; a transmission gate circuit 40 having node A connected to node N4 and node B connected to node N8 outputting signal DBRB<i>, and receiving an output of inverter 36 at node E; and a transmission gate circuit 42 having node A connected to node N5 and node B connected to node N8, and receiving signal SFTE<i> at node E.

Figure 4:
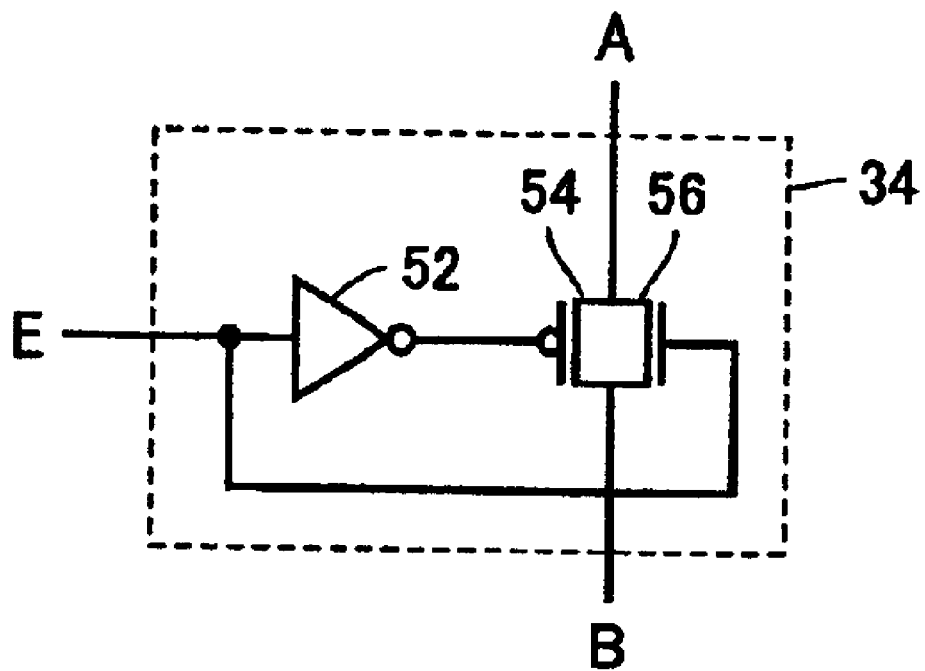
FIG. 4 is a circuit diagram showing a configuration of transmission gate circuit 34 in FIG. 3.

FIG. 4 is a circuit diagram showing a configuration of transmission gate circuit 34 in FIG. 3.

Referring to FIG. 4, transmission gate circuit 34 includes an inverter 52 inverting a signal provided to node E; a P channel MOS transistor 54 connected between nodes A and B and receiving an output of inverter 52 at a gate; and an N channel MOS transistor 56 connected between nodes A and B and having a gate connected to node E.

Transmission gate circuit 34 connects nodes A and B when node E is supplied with H level, while it disconnects node A from node B when node E is supplied with L level.

Figure 5:
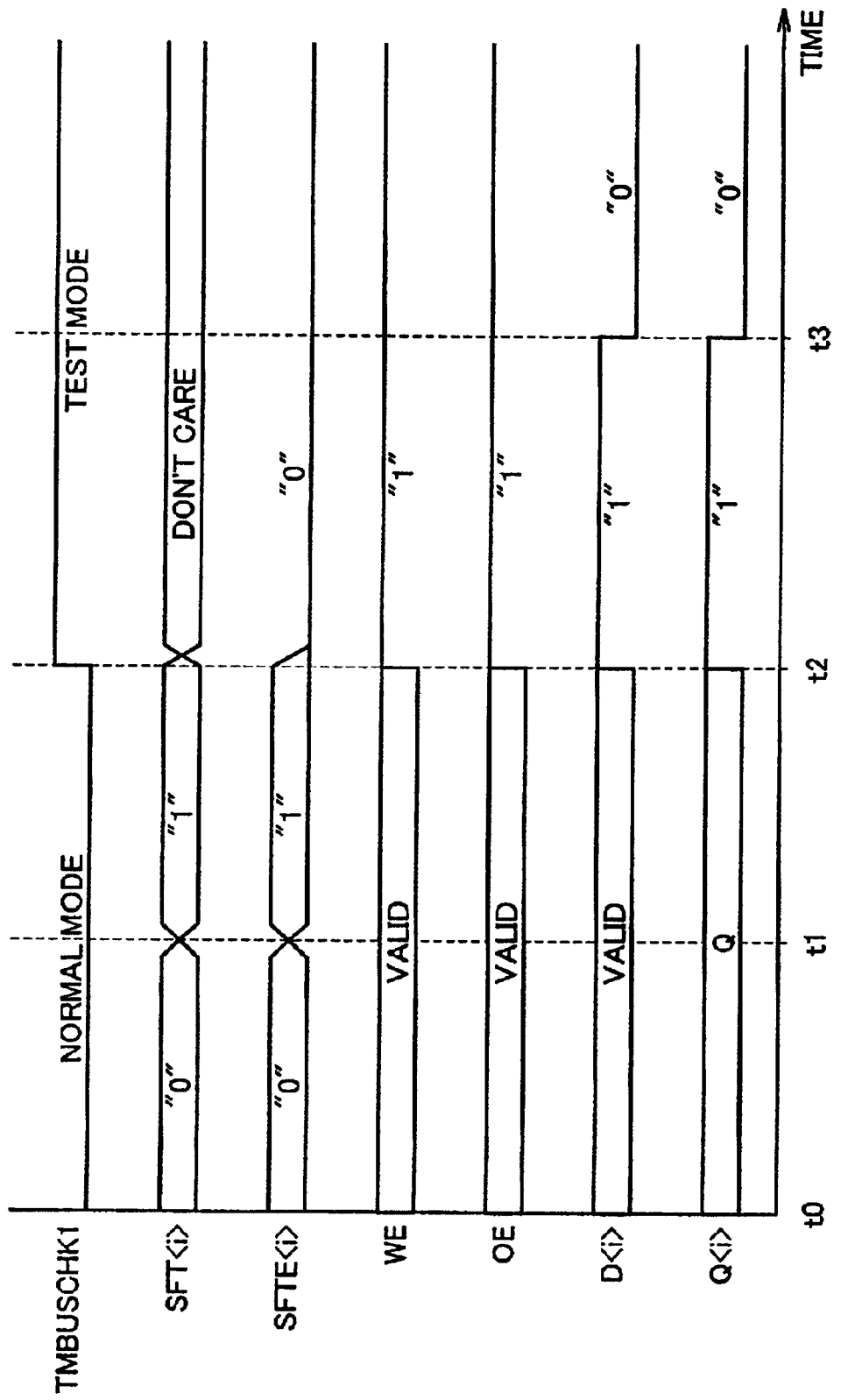
FIG. 5 is a diagram of operation waveforms illustrating a test operation of shift switch circuit 22 shown in FIG. 3.

FIG. 5 is a diagram of operation waveforms illustrating a test operation of shift switch circuit 22 shown in FIG. 3.

Referring to FIGS. 3 and 5, an operation in a test mode is shown, in which test control signal TMBUSCHK1 is set to H level after time t2, though until time t2 a normal operation is performed, that is, operation is in a normal mode.

First, at time t0–t1, test control signal TMBUSCHK1 is set to L level and a value "0" is given to shift control signal SFT<i>. Then AND circuit 26 outputs shift control signal SFT<i> as it is, so that signal SFTE<i> is "0". Control signals WE, OE and data input signal D<i> are valid, and accordingly, data output signal Q<i> is output.

At time t1–t2, shift control signal SFT<i> is set to "1". AND circuit 26 then outputs shift control signal SFT<i> as it is, as signal SFTE<i>. Here again, control signals WE, OE and data input signal D<i> are valid, and accordingly, data output signal Q<i> is output.

At time t2–t3, a test to determine whether data line shift circuit 12 and input/output circuit 14 function normally or not is conducted prior to programming fuse circuit 8 in FIG. 2.

As test control signal TMBUSCHK1 is set to H level after time t2, signal SFTE<i> is set to "0" regardless of a value of shift control signal SFT<i>. Signals WE1, OE1 are both forcibly set to "1". Here, when "1" is given as data input signal D<i>, this value is output as data output signal Q<i> via nodes N1, N2, N4 and N8.

When "0" is given as data input signal D<i> at time t3, this value is similarly output as data output signal Q<i> via nodes N1, N2, N4 and N8.

By confirming a match between input data signal D<i> and output data signal Q<i> after time t2, whether a data bus is defective or not can be examined.

As described above, according to the first embodiment of the present invention, in a memory having data line redundancy replacement of a shifting type, a defect in a data bus between an input/output buffer and a shift switch can be detected, and the cost for testing and assembly can be reduced.

(Second Embodiment)

In a second embodiment, an example will be described, in which a write data line and a read data line are separate and each has a shift switch, while input/output of data from/to the outside is performed through a common input/output data bus.

Figure 6:
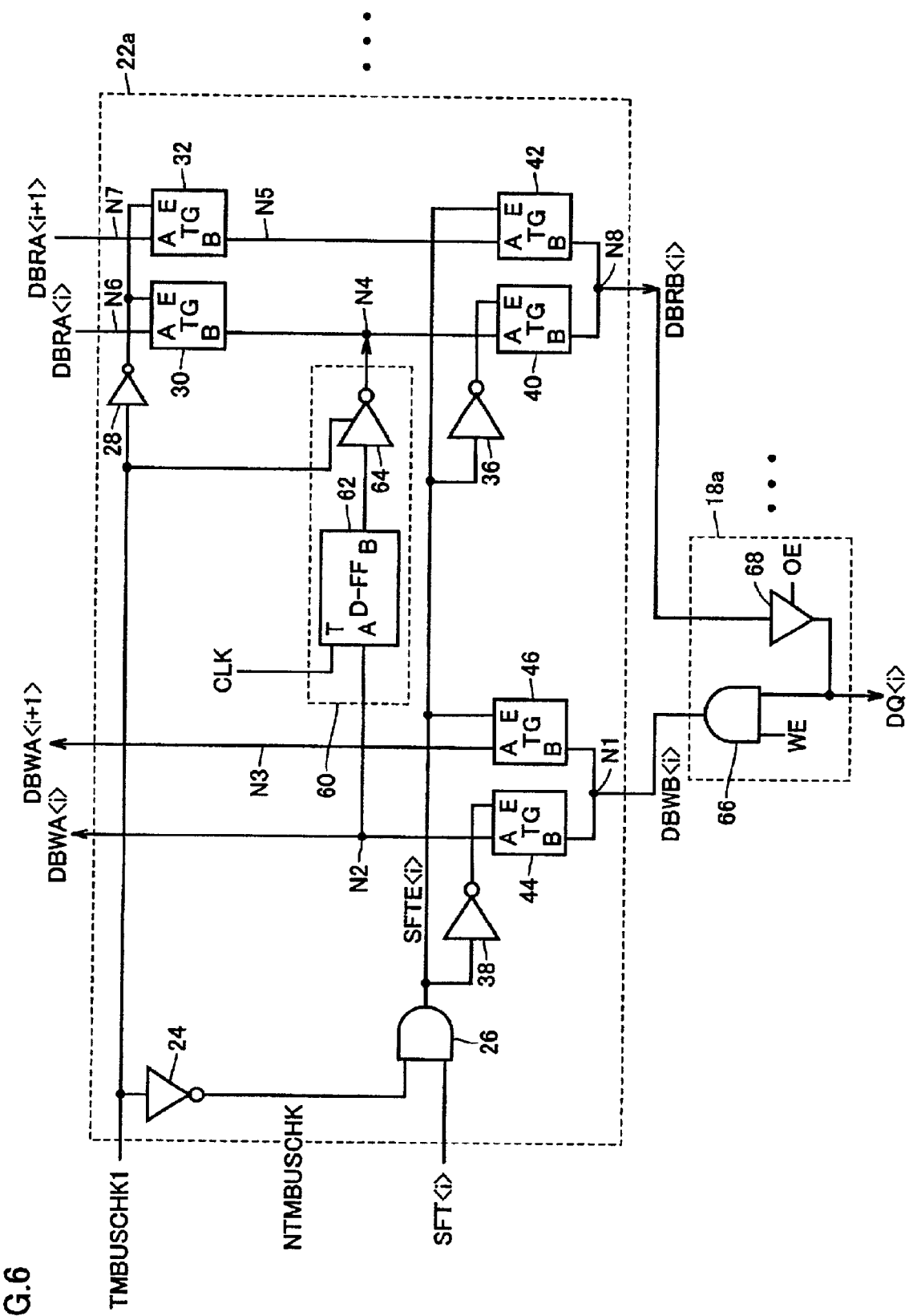
FIG. 6 is a circuit diagram showing a configuration of shift switch circuit 22a and input/output buffer 18a used in a second embodiment.

FIG. 6 is a circuit diagram showing a configuration of shift switch circuit 22a and input/output buffer 18a used in the second embodiment.

Referring to FIG. 6, in a configuration of input/output buffer 18 shown in FIG. 3, input/output buffer 18a includes an AND circuit 66 instead of AND circuit 48 and a tristate buffer circuit 68 instead of tristate buffer circuit 50.

AND circuit 66 has one input connected to a node from/to which data signal DQ<i> is input/output, receives signal WE at other input, and outputs signal DBWB<i> to node N1.

Tristate buffer circuit 68 is activated upon receiving signal OE and outputs signal DBRB<i> as data signal DQ<i>.

Other configuration of input/output buffer 18a is the same as that of input/output buffer 18, and description thereof will not be repeated.

In a configuration of shift switch circuit 22 shown in FIG. 3, shift switch circuit 22a includes a data transmission circuit 60 instead of transmission gate circuit 34.

Data transmission circuit 60 includes a D flip-flop 62 taking in a signal transmitted to node N2, in response to clock signal CLK; and a clocked inverter 64 activated by test control signal TMBUSCHK1 and receiving and inverting an output of D flip-flop 62. An output from clocked inverter 64 is connected to node N4.

In a normal operation, test control signal IMBUSCHK1 is set to L level, clocked inverter 64 is inactivated, and transmission gate circuits 30, 32 are activated. Shift switch circuit 22a determines to which of nodes N2, N3 signal DBWB<i> should be transmitted, in response to shift control signal SFT<i>.

Similarly, which of signals DBRA<i> and DBRA<i+1> should be transmitted to node N8 will also be determined in accordance with shift control signal SFT<i>.

Next, a testing operation will be described.

Figure 7:
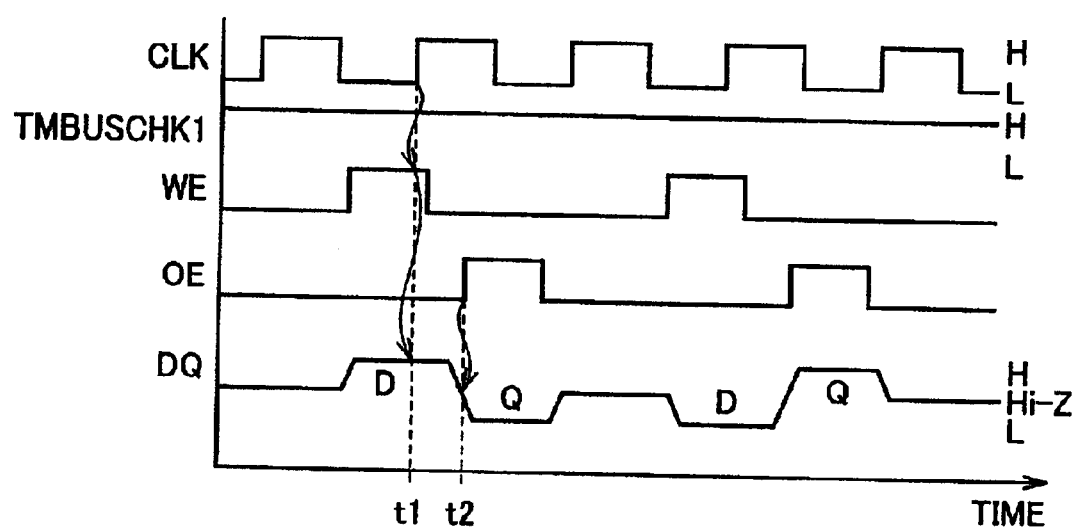
FIG. 7 is a diagram of operation waveforms illustrating an operation in testing, of shift switch circuit 22a shown in FIG. 6.

FIG. 7 is a diagram of operation waveforms illustrating an operation in testing, of shift switch circuit 22a shown in FIG. 6.

Referring to FIGS. 6 and 7, first, control signal WE is activated to H level and an input D for testing is then given to an input/output node of input/output buffer 18a. When clock signal CLK rises from L level to H level at time t1, a signal which has been transmitted as far as node N2 is taken into D flip-flop 62. The signal taken in and held is then transmitted to node N4 by clocked inverter 64 and to node N8 through transmission gate circuit 40. When control signal OE is activated to H level at time t2, a test result signal Q is output to the input/output node of input/output buffer 18a. Here, transmission gate circuits 44, 40 are in a conducting state and transmission gate circuits 46, 30, 32 and 42 are in a non-conducting state.

Data is inverted between the input and the output by clocked inverter 64 so that write data of a shared bus connected to the input/output node of input/output buffer 18a will not remain when reading.

As described above, inputting data from DQ<i> in synchronization with clock signal CLK, the data is once latched at the flip-flop, and the data inverted at next clock is output as signal DQ<i>. By confirming that the inverted data is provided as output data with respect to the input data, whether a data bus is defective or not can be examined.

(Third Embodiment)

Figure 8:
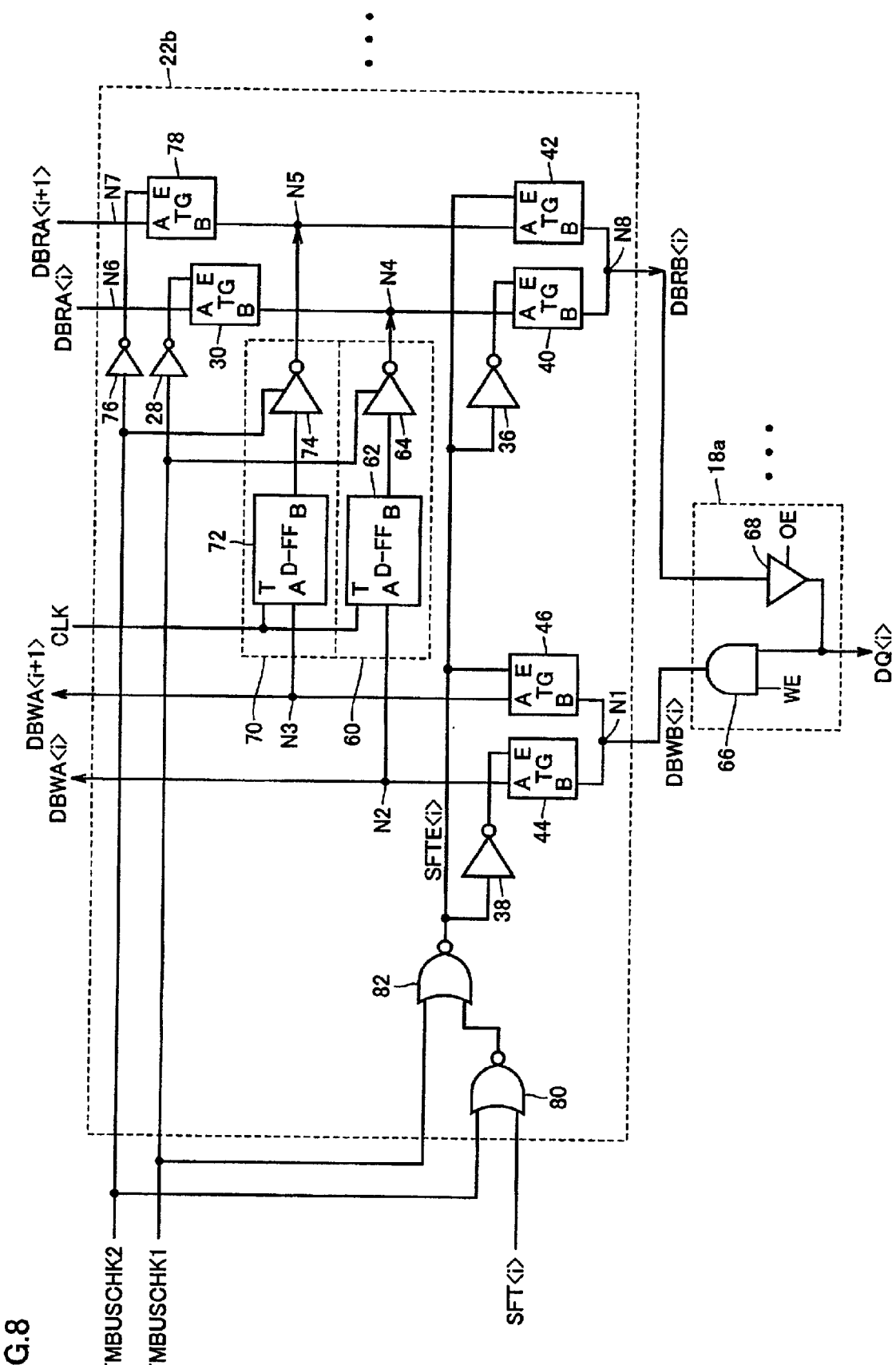
FIG. 8 is a circuit diagram showing a configuration of shift switch circuit 22b used in a third embodiment.

FIG. 8 is a circuit diagram showing a configuration of shift switch circuit 22b used in a third embodiment.

Referring to FIG. 8, in a configuration of shift switch circuit 22a shown in FIG. 6, shift switch circuit 22b includes NOR circuits 80, 82, an inverter 76 and a transmission gate circuit 78 instead of inverter 24, AND circuit 26 and transmission gate circuit 32.

NOR circuit 80 receives shift control signal SFT<i> and test control signal TMBUSCHK2. NOR circuit 82 outputs signal SFTE<i> upon receiving test control signal TMBUSCHK1 and an output of NOR circuit 80. Inverter 76 receives and inverts test control signal TMBUSCHK2. Transmission gate circuit 78 has node A connected to node N7 and node B connected to node N5, and receives an output of inverter 76 at node E. Transmission gate circuit 78 is of the same configuration as transmission gate circuit 34 shown in FIG. 4, and description thereof will not be repeated.

FIG. 9 shows a diagram illustrating an operation of shift switch circuit 22b shown in FIG. 8.

Referring to FIGS. 8 and 9, in a normal operation, both test control signals TMBUSCHK1 and TMBUSCHK2 are at L level, clocked inverters 74, 64 are inactivated and transmission gate circuits 30, 78 are in a conducting state. Shift switch circuit 22b, in accordance with signal SFTE<i>, makes a switch between DBWA<i> and DBWA<i+1>, that is, determines to which side signal DBWB<i> provided to node N1 should be transmitted. Similarly, shift switch circuit 22b, in accordance with shift control signal SFTE<i>, makes a switch between DBRA<i> and DBRA<i+1>, that is, determines which of signals DBRA<i> and DBRA<i+1> should be transmitted to node N8.

When test control signal TMBUSCHK1 is set to H level and test control signal TMBUSCHK2 is set to L level, clocked inverter 64 is activated while clocked inverter 74 is inactivated.

Transmission gate circuits 44, 40 are in a conducting state and transmission gate circuits 46, 42 are in a non-conducting state. D flip-flop 62, in synchronization with a rising edge of dock signal CLK, outputs from output node B a signal provided to input node A.

Therefore, input signal D provided from the input/output node of input/output buffer 18a returns thereto via nodes N1, N2, N4 and N8 in accordance with output enable signal OE. Input/output timing is the same as in FIG. 7, and description thereof will not be repeated.

On the other hand, when test control signal TMBUSCHK2 is set to H level and test control signal TMBUSCHK1 is set to L level, clocked inverter 74 is active while clocked inverter 64 is inactive. In addition, transmission gate circuits 44, 40 are in a non-conducting state and transmission gate circuits 46, 42 are in a conducting state. D flip-flop 72, in synchronization with a rising edge of clock signal CLK, outputs from output node B a signal provided to input node A.

Therefore, provided test signal is output from tristate buffer circuit 68 via nodes N1, N3, N5 and N8.

Thus, by conducting a test twice using two test modes, whether switch circuits on both <i> and <i+1> sides function normally or not can be checked.

When data input and output are separate, similar effects will be obtained by simply adding a transmission gate circuit without using a flip-flop circuit, as shown in the first embodiment.

Figure 10:
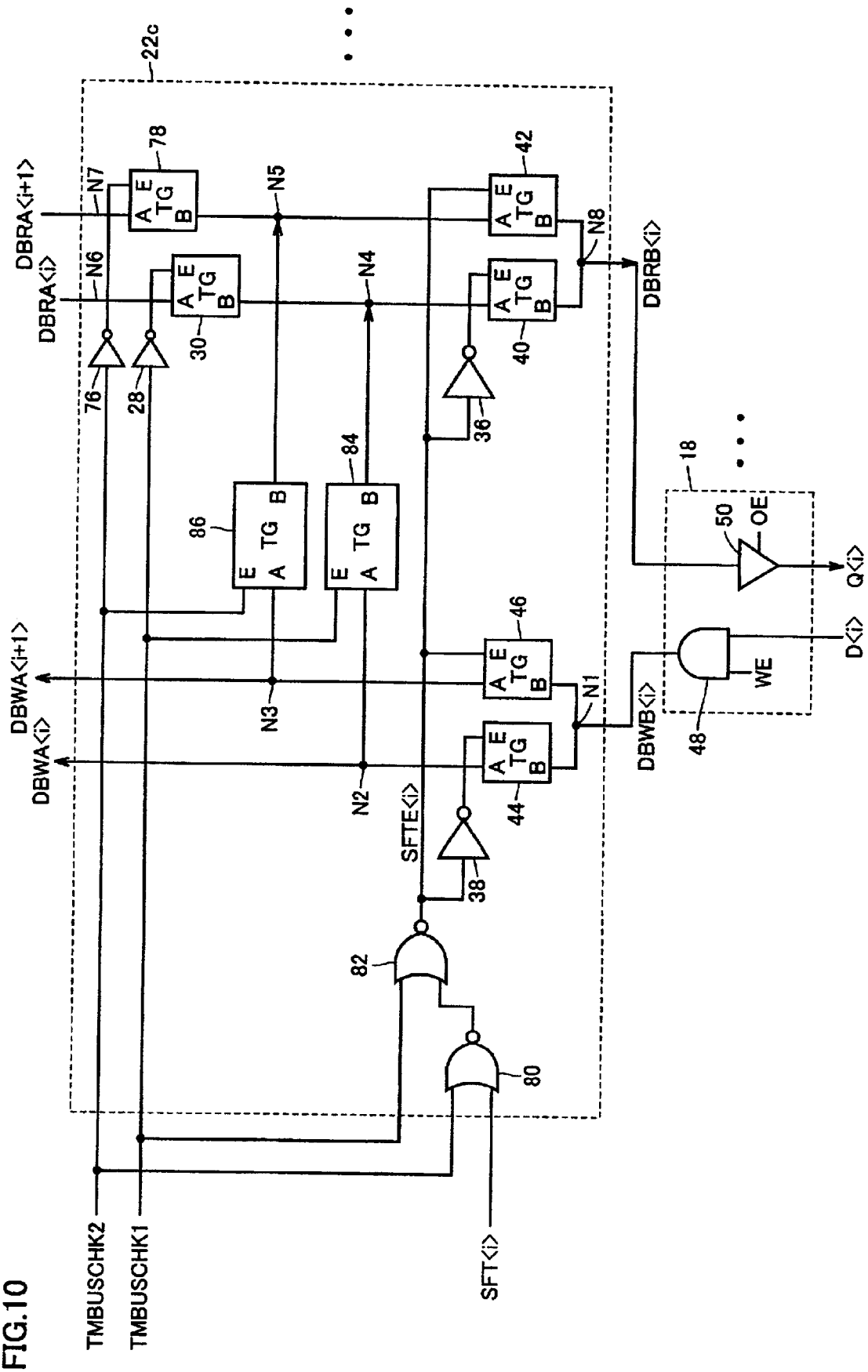
FIG. 10 shows a variation when data input and output are separate.

FIG. 10 shows a variation when data input and output are separate.

Referring to FIG. 10, in the configuration of shift switch circuit 22b shown in FIG. 8, a shift switch circuit 22c includes transmission gate circuits 84, 86 instead of data transmission circuits 60, 70.

Transmission gate circuit 84 has node A connected to node N2 and node B connected to node N4, and receives signal TMBUSCHK1 at node E. Transmission gate circuit 86 has node A connected to node N3 and node B connected to node N5, and receives signal TMBUSCHK2 at node E. Transmission gate circuits 84, 86 are of the same configuration as transmission gate circuit 34 shown in FIG. 4, and description thereof will not be repeated.

(Fourth Embodiment)

Figure 11:
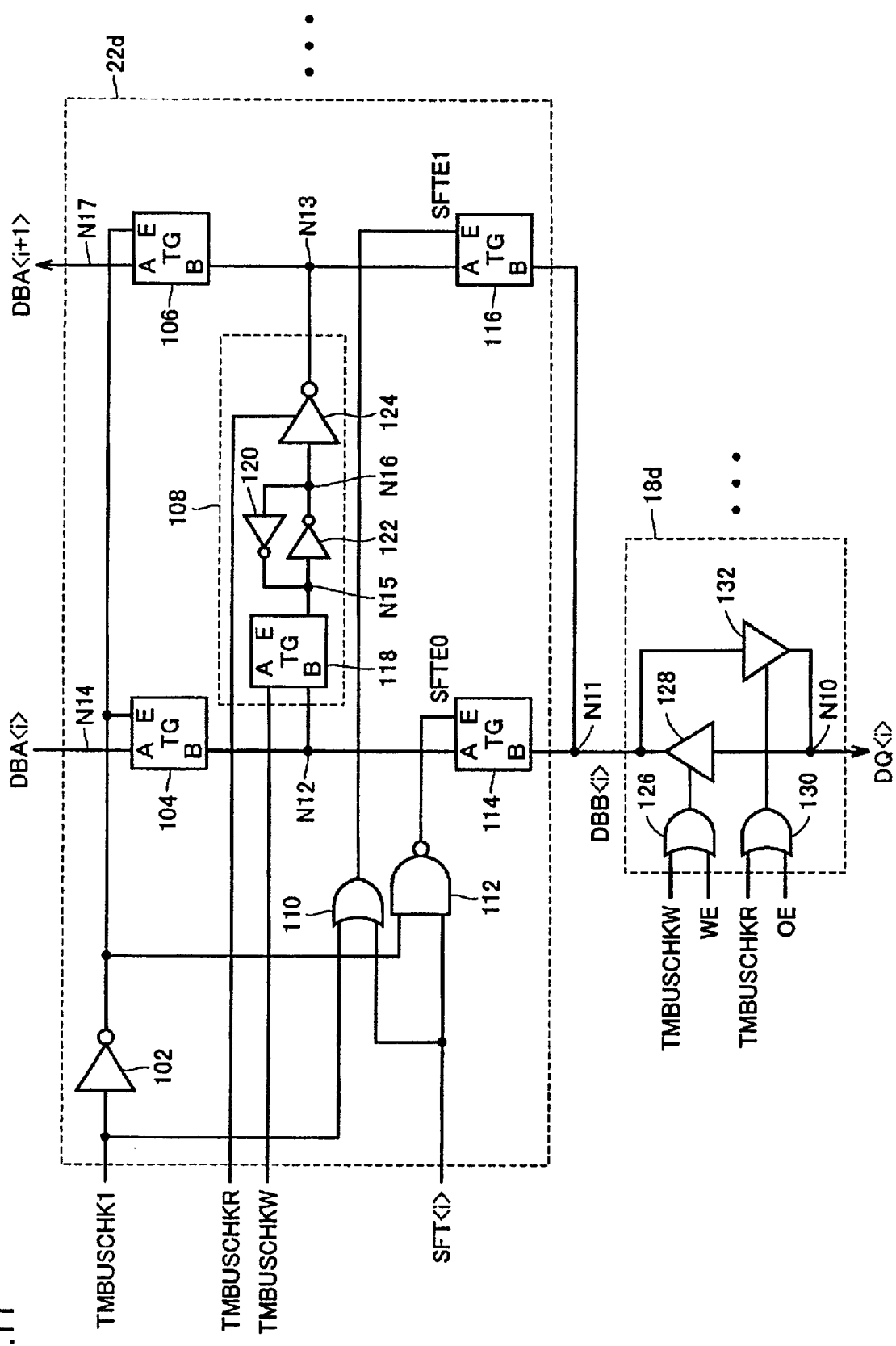
FIG. 11 is a circuit diagram showing a configuration of shift switch circuit 22d and input/output buffer 18d used in a fourth embodiment.

FIG. 11 is a circuit diagram showing a configuration of shift switch circuit 22d and input/output buffer 18d used in a fourth embodiment.

Referring to FIG. 11, shift switch circuit 22d corresponds to number <i> data line, where i is an integer not smaller than 0 and not larger than n.

Here, an example is shown, in which write bus and read bus toward memory array are configured as a common data bus and a shift switch is used both for read and write.

Shift switch circuit 22d includes an inverter 102 receiving and inverting test control signal TMBUSCHK1; an OR circuit 110 outputting signal SFTE1 upon receiving test control signal TMBUSCHK1 and shift control signal SFT<i>; and an NAND circuit 112 outputting signal SFTE0 upon receiving shift control signal SFT<i> and an output of inverter 102.

Shift switch circuit 22d further includes: a transmission gate circuit 114 having node B connected to node N11 and node A connected to node N12, and receiving signal SFTE0 at node E; a transmission gate circuit 104 having node B connected to node N12 and node A connected to node N14, and receiving an output of inverter 102 at node E; a transmission gate circuit 106 having node A connected to node N17 and node B connected to node N13, and receiving an output of inverter 102 at node E; a transmission gate circuit 116 having node A connected to node N13 and node B connected to node N11, and receiving signal SFTE1 at node E; and a data transmission circuit 108 connected between node N12 and node N13.

Signal DBB<i> is input and output via node N11. Node N14 receives signal DBA<i> from memory cell array. Signal DBA<i+1> is input and output from/to memory cell array via node N17.

Data transmission circuit 108 includes: a transmission gate circuit 118 having node A connected to node N12 and node B connected to node N15, and receiving signal TMBUSCHKW at node E; an inverter 122 having an input connected to node N15 and an output connected to node N16; an inverter 120 having an input connected to node N16 and an output connected to node N15; and a clocked inverter 124 having an input connected to node N16 and an output connected to node N13, and activated in accordance with signal TMBUSCHKR.

Input/output buffer 18d includes: an OR circuit 126 receiving control signal WE and signal TMBUSCHKW; a tristate buffer circuit 128 having an input connected to node N10 and an output connected to node N11, and activated in accordance with an output of OR circuit 126; an OR circuit 130 receiving control signal OE and signal TMBUSCHKR; and a tristate buffer circuit 132 having an input connected to node N11 and an output connected to node N10, and activated in accordance with an output of OR circuit 130. Node N10 is connected to a data bus commonly used for read and write, for communicating data between a memory core and an embedded logic.

Figure 12:
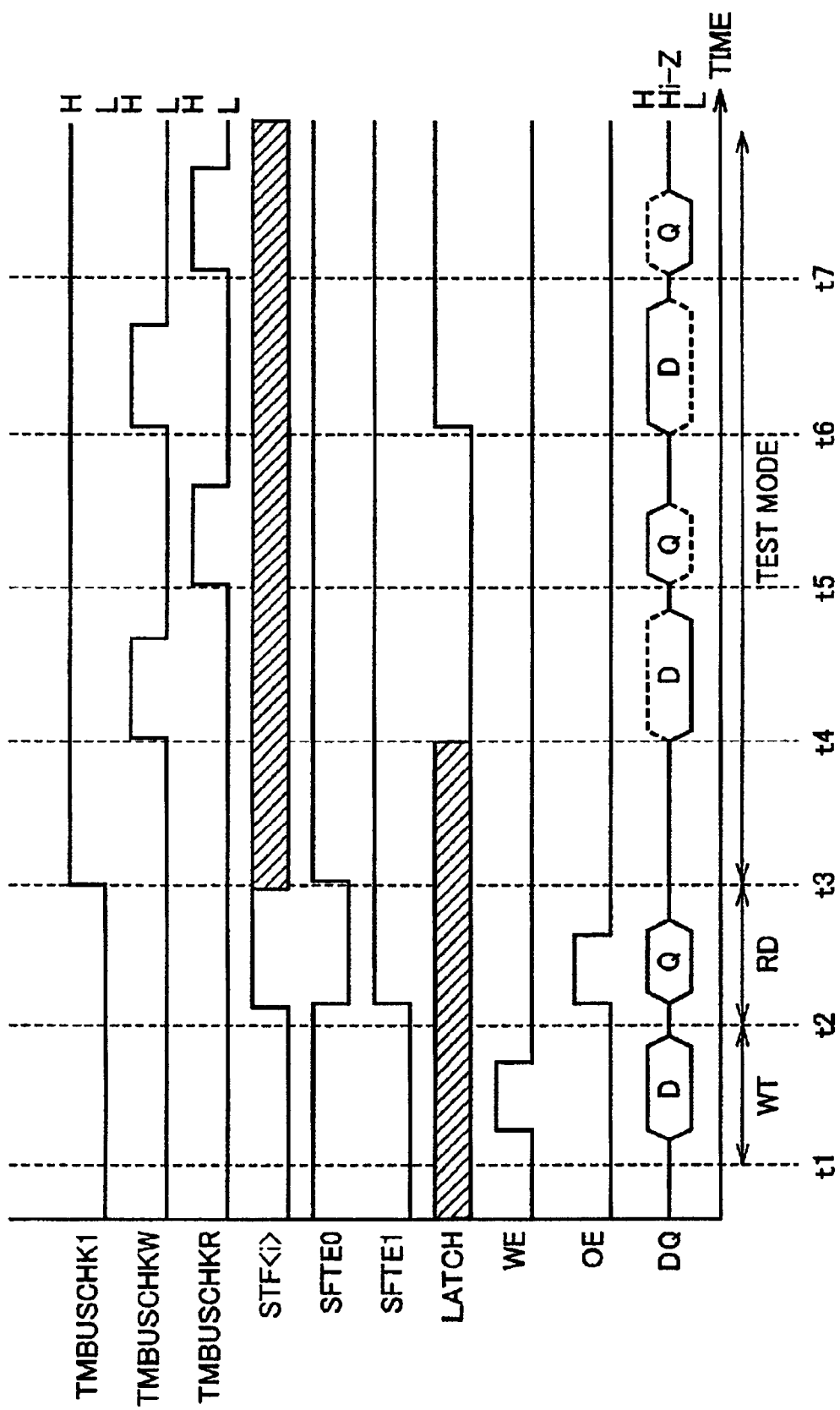
FIG. 12 is a diagram of operation waveforms illustrating an operation of the circuit shown in FIG. 11.
Figure 13:
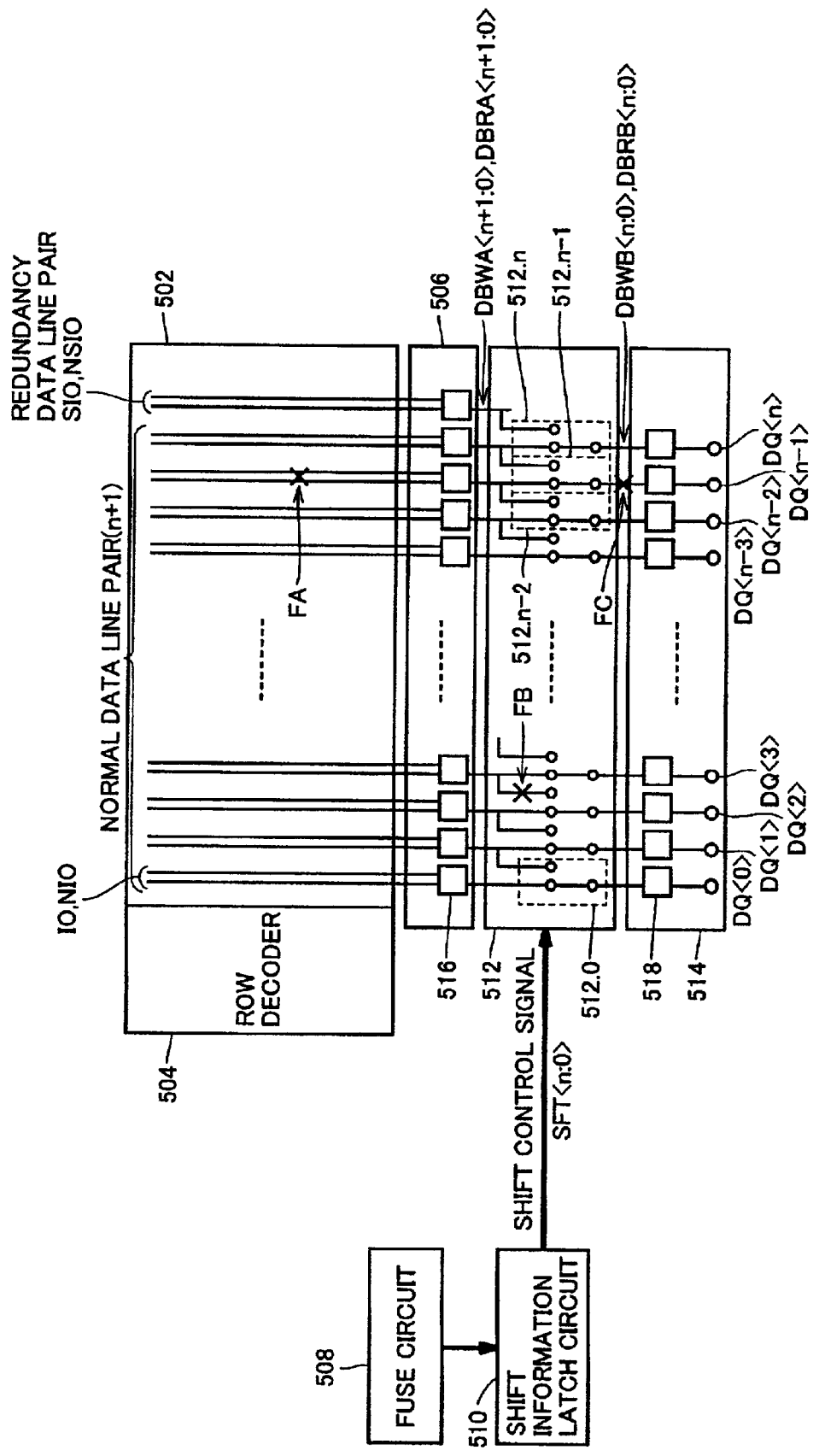
FIG. 13 shows an example of a semiconductor memory device with a conventional data line redundancy replacement configuration.
Figure 14:
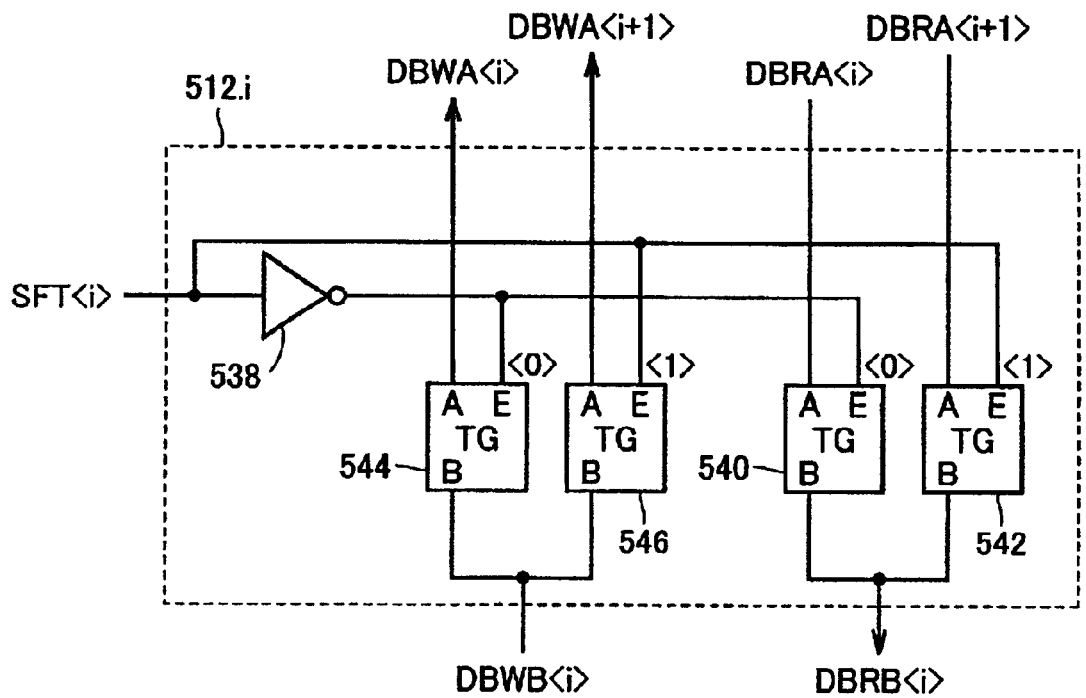
FIG. 14 is a circuit diagram showing a configuration of ith shift switch 512.i in FIG. 13.
Figure 15:
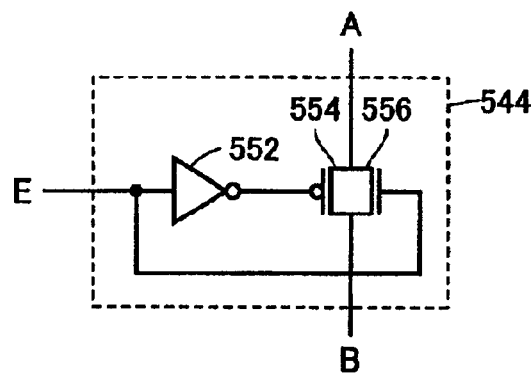
FIG. 15 is a circuit diagram showing a configuration of transmission gate circuit 544 in FIG. 14.

FIG. 12 is a diagram of operation waveforms illustrating an operation of the circuit shown in FIG. 11.

Referring to FIGS. 11 and 12, in a normal state of use until time t3, signals IMBUSCHK1, IMBUSCHKR and TMBUSCHKW are all set to L level. Here, transmission gate circuits 104, 106 are in a conducting state, and transmission gate circuits 114, 116, in accordance with shift control signal SFT<i>, make a switch between DBA<i> and DBA<i+1>, that is, determines to which side data should be transmitted. Here also, transmission gate circuit 118 and clocked inverter 124 are inactivated.

As shown at t1–t2, write operation is performed when control signal WE is at H level and control signal OE is at L level. As also shown at t2–t3, read operation is performed when control signal WE is at L level and control signal OE is at H level.

When signal TMBUSCHK1 is set to H level at time t3, test mode is set and both shift control signals SFTE0 and SFTE1 attain to H level. In addition, transmission gate circuits 104, 106 are rendered non-conductive, and memory cell array side and nodes N12, N13 are disconnected. When signal TMBUSCHKW is set to H level at time t4 while allowing signal TMBUSCHK1 to be kept at H level, transmission gate circuit 118 is rendered conductive and write data is written into a latch circuit consisting of inverters 120, 122. When signal TMBUSCHKW is set to L level, write data will be held at nodes N15, N16.

When signal TMBUSCHKR is set to H level at time t5 while allowing signal TMBUSCHK1 to be kept at H level, clocked inverter 124 is activated and inverted data of input data held at node N16 is output to node N11 via node N13. Data is then output as signal DQ<i> by input/output buffer 18d.

Through operations in a sequence as described above, whether a data bus including a shift switch circuit is defective or not can be examined.

Thus, since a path to transmit data to a memory cell array through a data line shift circuit can be confirmed, successful replacement of a normal data line with a redundancy data line is more likely, which is effective in efficient production of a semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode and a normal mode as operation modes, comprising:
    a memory cell array divided into a plurality of areas;
    a plurality of read data lines provided corresponding to said plurality of areas, respectively, to communicate data;
    a plurality of write data lines provided corresponding to said plurality of areas, respectively, to communicate data;
    a replacement control circuit for holding replacement information in a non-volatile manner and outputting a shift control signal in accordance with said replacement information; and
    a data line shift circuit for selecting a prescribed number of read data lines to be used from said plurality of read data lines and selecting a prescribed number of write data lines to be used from said plurality of write data lines, said data line shift circuit including
        a first switch circuit for connecting, in said normal mode, either one of first and second write data lines of said plurality of write data lines to a first input node in accordance with said shift control signal and connecting, in said test mode, said first write data line to said first input node,
        a second switch circuit for connecting, in said normal mode, either one of first and second read data lines of said plurality of read data lines to a first output node in accordance with said shift control signal and connecting, in said test mode, said first read data line to said first output node, and
        a first data transmission circuit configured to be activated in said test mode and configured for transmitting data of said first write data line to said first read data line.

2. The semiconductor memory device according to claim 1, further comprising an input/output circuit for outputting a write data signal to said first input node and receiving a read data signal output from said first output node, wherein
    said input/output circuit includes
        an input circuit for receiving said write data signal from a write data bus and providing said write data signal to said first input node, and
        an output circuit for receiving said read data signal output from said first output node and outputting said read data signal to a read data bus; and
    said first data transmission circuit includes a first transmission gate circuit provided on a path communicating data of said first write data line to said first read data line, and configured to be in a conducting state in said test mode and in a non-conducting state in said normal mode.

3. The semiconductor memory device according to claim 2, wherein
    said data line shift circuit further includes a signal output portion for activating a shift enable signal in said test mode and activating in accordance with said shift control signal said shift enable signal in said normal mode;
    said first switch circuit includes
        a second transmission gate circuit connected between said first write data line and said first input node and configured to be in a non-conducting state and in a conducting state respectively in accordance with activation and inactivation of said shift enable signal, and
        a third transmission gate circuit connected between said second write data line and said first input node and configured to be in a conducting state and in a non-conducting state respectively in accordance with activation and inactivation of said shift enable signal; and
    said second switch circuit includes
        a fourth transmission gate circuit connected between said first read data line and said first output node and configured to be in a non-conducting state and in a conducting state respectively in accordance with activation and inactivation of said shift enable signal, and
        a fifth transmission gate circuit connected between said second read data line and said first output node and configured to be in a conducting state and in a non-conducting state respectively in accordance with activation and inactivation of said shift enable signal.

4. The semiconductor memory device according to claim 1, wherein
    said plurality of read data lines include
        a plurality of normal read data lines and
        a redundancy read data line; and
    said plurality of write data lines include
        a plurality of normal write data lines and
        a redundancy write data line.

* * * * *